(12) United States Patent
Sloey et al.

(10) Patent No.: US 9,232,668 B2
(45) Date of Patent: Jan. 5, 2016

(54) COMPACT EJECTABLE COMPONENT ASSEMBLIES IN ELECTRONIC DEVICES

(71) Applicant: Apple Inc., Cupertino, CA (US)

(72) Inventors: Jason Sloey, San Jose, CA (US); Michelle Yu, Oakland, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/058,360

(22) Filed: Oct. 21, 2013

(65) Prior Publication Data

US 2014/0049920 A1   Feb. 20, 2014

Related U.S. Application Data

(63) Continuation of application No. 12/793,980, filed on Jun. 4, 2010, now Pat. No. 8,564,965.

(60) Provisional application No. 61/325,622, filed on Apr. 19, 2010.

(51) Int. Cl.
| | |
|---|---|
| H05K 5/00 | (2006.01) |
| H01R 13/62 | (2006.01) |
| H01R 24/00 | (2011.01) |
| H05K 5/02 | (2006.01) |
| H04B 1/3816 | (2015.01) |
| G06K 7/00 | (2006.01) |

(52) U.S. Cl.
CPC .............. *H05K 5/0217* (2013.01); *G06K 7/003* (2013.01); *H04B 1/3816* (2013.01); *H04M 2250/14* (2013.01); *Y10T 29/49117* (2015.01); *Y10T 29/49208* (2015.01); *Y10T 29/49826* (2015.01)

(58) Field of Classification Search
CPC ....... H05K 7/1409; G06F 1/184; G06F 1/185; G06F 1/186; G02B 6/4246; H01R 13/635; H01R 13/633
See application file for complete search history.

(56) References Cited

U.S. PATENT DOCUMENTS

| | | | |
|---|---|---|---|
| 6,075,706 A | 6/2000 | Learmonth et al. | |
| 6,330,151 B1 | 12/2001 | Bates, III | |
| 6,717,805 B2 | 4/2004 | Liu et al. | |
| 6,717,817 B2 | 4/2004 | Liu et al. | |
| 7,306,491 B1* | 12/2007 | Wei | 439/630 |
| 7,442,086 B1* | 10/2008 | Chang | 439/630 |
| 7,458,857 B2 | 12/2008 | Lin et al. | |
| 7,503,806 B2 | 3/2009 | Lin | |
| 7,568,928 B2* | 8/2009 | Hou et al. | 439/188 |
| 7,766,678 B1* | 8/2010 | Abe | 439/159 |
| 7,794,232 B2 | 9/2010 | Ogatsu | |
| 7,837,486 B2 | 11/2010 | Li | |
| 7,865,210 B2 | 1/2011 | Wang et al. | |
| 8,102,657 B2 | 1/2012 | Hiew et al. | |
| 8,270,175 B2* | 9/2012 | Duan et al. | 361/737 |
| 2003/0195020 A1* | 10/2003 | Kubo | 455/575.1 |
| 2006/0079133 A1* | 4/2006 | Kim | 439/630 |

(Continued)

*Primary Examiner* — Hoa C Nguyen
*Assistant Examiner* — Xanthia C Cunningham
(74) *Attorney, Agent, or Firm* — Brownstein Hyatt Farber Schreck, LLP

(57) ABSTRACT

Electronic devices are provided with ejectable component assemblies. Each ejectable component assembly may include a tray that can be loaded with one or more types of removable module, such as a mini-SIM card and a micro-SIM card, and inserted into the device. Each assembly may also include a base coupled to a circuit board for electrically coupling with the removable module, a cage for biasing the module down against the base, and a guide for retaining the module at a functional insertion position within the device.

20 Claims, 11 Drawing Sheets

(56) References Cited

U.S. PATENT DOCUMENTS

| | | |
|---|---|---|
| 2007/0149059 A1* | 6/2007 | Zuo et al. .................... 439/630 |
| 2007/0173124 A1* | 7/2007 | Lin et al. .................... 439/630 |
| 2008/0090446 A1 | 4/2008 | Lamont et al. |
| 2009/0023319 A1* | 1/2009 | Hou et al. .................... 439/159 |

\* cited by examiner

“COMPACT EJECTABLE COMPONENT ASSEMBLIES IN ELECTRONIC DEVICES

TECHNICAL FIELD

This application is a continuation patent application of U.S. patent application Ser. No. 12/793,980, filed Jun. 4, 2010 and titled "Compact Ejectable Component Assemblies in Electronic Devices," which claims the benefit of U.S. Provisional Patent Application No. 61/325,622, filed Apr. 19, 2010 and titled "Compact Ejectable Component Assemblies in Electronic Devices," the disclosures of which are hereby incorporated herein in their entireties.

TECHNICAL FIELD

This can relate to systems and methods for providing compact ejectable component assemblies in electronic devices.

BACKGROUND

To enhance the use of electronic devices (e.g., cellular telephones), ejectable component assemblies may be used to couple removable modules (e.g., subscriber identity module ("SIM") cards) to the device. Some known ejectable component assemblies for personal electronic devices include a tray for receiving a removable module, and a connector coupled to a circuit board within the housing of the device for receiving the tray as it is inserted through an opening in the housing. The connector may retain the tray such that contacts of the module may be electrically coupled to the circuit board. However, variations in the manufacture of such electronic devices and the reduction in size of such modules generally create shorts between contacts of the module and other components of the assembly.

SUMMARY OF THE DISCLOSURE

Systems and methods for providing compact ejectable component assemblies in electronic devices are provided.

For example, in some embodiments, there is provided a tray for inserting a removable module into an electronic device. The tray includes a back component configured to retain at least a portion of the module and a front component fixed to the back component and configured to mate with an opening in a housing of the electronic device. A portion of the back component may be configured to touch an electrical contact of the module, and may be covered with a non-conductive coating or element.

In other embodiments, there is provided a method for forming a tray for an ejectable module assembly of an electronic device. The method includes forming a back component for retaining at least a portion of an ejectable module, forming a front component for mating with an opening in a housing of the electronic device, and fixing the back component to the front component. The method may also include applying a non conductive element to at least one portion of the back component.

In yet other embodiments, there is provided an electronic device that includes a housing having an opening, a circuit board within the housing, a cage, a fixing element coupling the cage to the circuit board, and a tray operable to be inserted through the opening and into a space between the cage and the circuit board. The fixing element may only allow the tray to be inserted into the space when the tray is in a first orientation with respect to the circuit board. The electronic device may also include a guide positioned at least partially within the cage, wherein the fixing element is positioned between the guide and the opening.

In still yet other embodiments, there is provided an electronic device that includes a housing having an opening, a guide within the housing, a tray operable to be inserted through the opening and along the guide, and a biasing mechanism. The biasing mechanism may include a first end fixed to a first portion of the guide, a second end abutting a second portion of the guide, and a middle portion biased against a portion of the tray. The portion of the tray may include a detent, and the middle portion of the biasing mechanism or the portion of the tray may include an overmold.

In still yet other embodiments, there is provided an electronic device that includes a housing having an opening, a circuit board within the housing, a base coupled to the circuit board, an electrical pin extending away from the base, and a module operable to be inserted through the opening and to contact the electrical pin. The electrical pin may be operable to deflect through a gap in the base in response to the module contacting the pin. The circuit board may include a recess, and the electrical pin may be operable to deflect into the recess in response to the module contacting the pin.

BRIEF DESCRIPTION OF THE DRAWINGS

The above and other aspects of the invention, its nature, and various features will become more apparent upon consideration of the following detailed description, taken in conjunction with the accompanying drawings, in which like reference characters may refer to like parts throughout, and in which.

DETAILED DESCRIPTION

Figure 1:
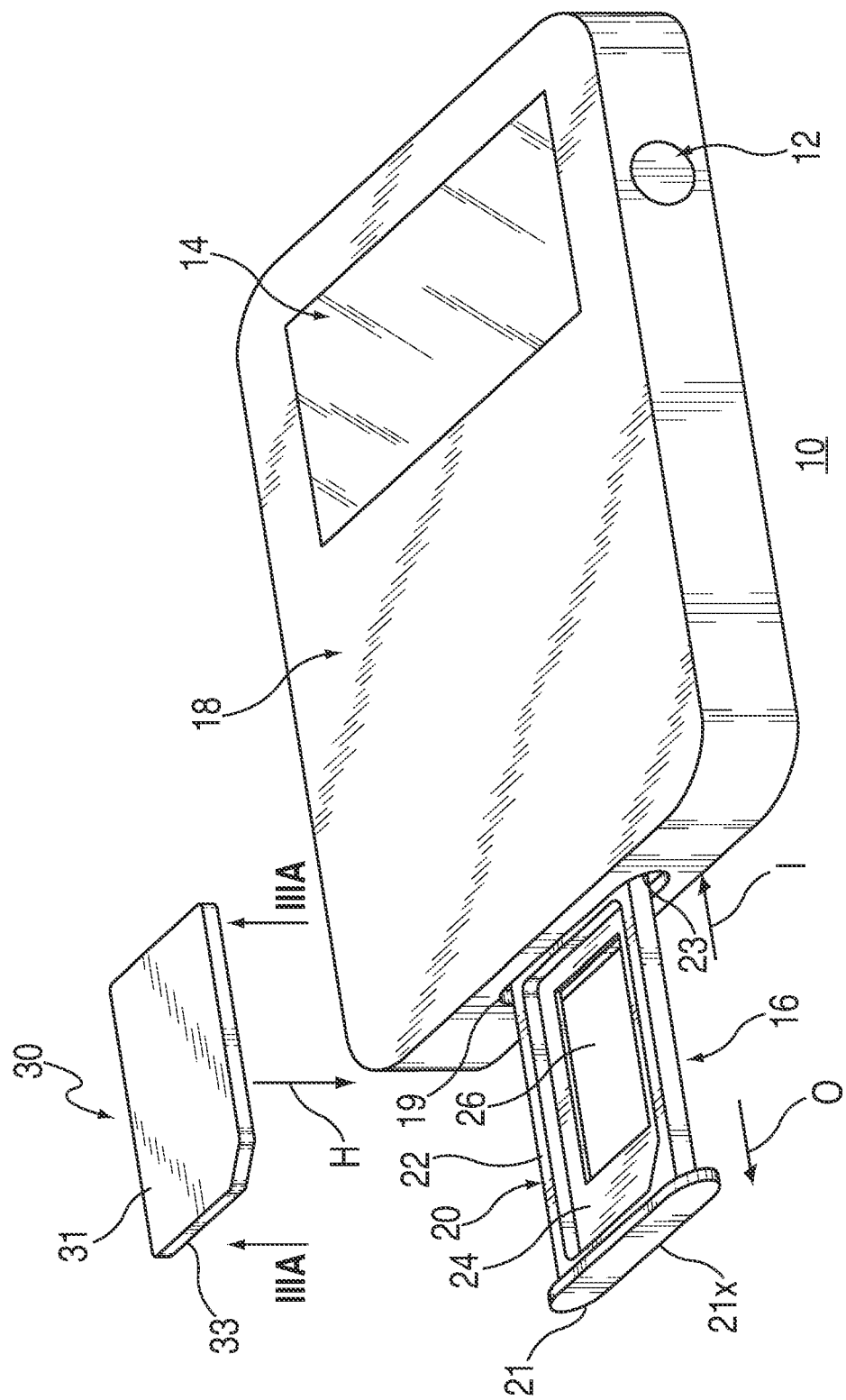
FIG. 1 is a perspective view of an illustrative electronic device that includes an ejectable component assembly in accordance with some embodiments of the invention.

Systems and methods for providing compact ejectable component assemblies in electronic devices are provided and described with reference to FIGS. 1-15.

An ejectable component assembly may include any suitable assembly operative to insert into an electronic device and eject from an electronic device a removable module, such as a subscriber identity module ("SIM") card. The assembly can include a module tray that may hold the module and be insertable into and ejectable from the device. The tray may include a cosmetic outer portion configured to match the exterior of the electronic device through which the tray may be inserted, and a holder inner portion configured to retain the module and load it into the electronic device. In order to closely define the size and shape of the junction between such a cosmetic outer portion and holder inner portion, such that the tray may form a tight fit with an opening through an external housing of the electronic device, these two portions may be provided as two distinct tray portions that may be welded or otherwise adhered together to form the tray. By forming the tray using two distinct elements, the outer cosmetic portion may be formed with materials and processes similar to the exterior of the electronic device to make the device more cosmetically appealing to the user when the tray is loaded into the device, whereas the holder inner portion may be formed with different materials and processes that may be optimal for providing a rigid and functional module holding portion of the tray.

In some embodiments, at least the holder inner portion of the tray may be formed by a metal or other conductive material with enough rigidity to hold a module. Therefore, in order to avoid shorting electrical contacts of the module (e.g., a SIM card), one or more non-conductive portions may be provided along the holder inner portion of the tray. In such embodiments, at least some of the conductive portions or all of the tray can be anodized and/or coated with a non-conductive material and/or otherwise provided with non-conductive elements, such that it may be insulated and rendered non-conductive to avoid shorting any electrical contacts of the module that it might touch during use.

While the opening in the device may be sized and shaped to allow the tray to be inserted therethrough in any orientation, portions of the ejectable component assembly within the device may only be configured to receive the tray in one or more certain orientations. Therefore, one or more various keying elements of the ejectable component assembly may be provided within the electronic device adjacent the opening through which the tray may be inserted. Each keying element may be provided to limit the manner in which the tray may be inserted through the opening. For example, each keying element may only allow the tray to be inserted into the device when the tray is in a first orientation with respect to the opening or other components of the electronic device. A keying element may also be used to join distinct elements of the assembly to one another, such as a receiving cage and a circuit board of the device.

Electrical contacts of the removable module may be inserted into the device in order to functionally align with and electrically couple to electrical contacts extending from a circuit board of the device. In some embodiments, one or more recesses may be provided through the circuit board or other components of the device such that when the removable module physically interacts with the contacts, at least a portion of the contacts may be forced downwardly through the recesses. These recesses may prevent the contacts from being damaged during interaction with the module and/or during removal of the module from the device.

The following discussion describes various embodiments of an electronic device that includes at least one ejectable component assembly. The term "electronic device" can include, but is not limited to, music players, video players, still image players, game players, other media players, music recorders, video recorders, cameras, other media recorders, radios, medical equipment, calculators, cellular telephones, other wireless communication devices, personal digital assistants, remote controls, pagers, laptop computers, desktop computers, tablets, servers, printers, or combinations thereof. In some cases, the electronic device may perform a single function (e.g., an electronic device dedicated to playing music) and in other cases, the electronic device may perform several functions (e.g., an electronic device that plays music, displays video, stores pictures, and receives and transmits telephone calls).

The electronic devices may generally be any portable, mobile, hand-held, or miniature electronic device so as to allow a user, for example, to listen to music, play games, record videos, take pictures, and/or conduct communications operations (e.g., telephone calls) wherever he or she travels. Some miniature electronic devices may have a form factor that is smaller than that of hand-held electronic devices, such as an iPod™ available by Apple Inc. of Cupertino, Calif. Illustrative miniature electronic devices can be integrated into various objects that include, but are not limited to, watches, rings, necklaces, belts, accessories for belts, headsets, accessories for shoes, virtual reality devices, other wearable electronics, accessories for sporting equipment, accessories for fitness equipment, key chains, or any combination thereof. Alternatively, electronic devices that incorporate an ejectable component assembly may not be portable at all.

FIG. 1 is a perspective view of an illustrative electronic device 10 that may include an ejectable component assembly in accordance with some embodiments of the invention. Electronic device 10 can include at least one user input component assembly 12 that may allow a user to interface with the device, at least one device output component assembly 14 that may provide the user with device generated information, at least one ejectable component assembly 16 that may allow a user to insert and eject a removable module into and from the device, and a protective housing 18 that may at least partially enclose the one or more input, output, and ejectable component assemblies of device 10.

Component assemblies 12 and 14 can include any type of component assembly operative to receive and/or transmit digital and/or analog data (e.g., audio data, video data, other types of data, or a combination thereof). Input component assembly 12 may include any suitable input mechanism, such as, for example, sliding switches, buttons, keypads, track balls, joysticks, dials, scroll wheels, touch screen displays, electronics for accepting audio and/or visual information, antennas, infrared ports, or combinations thereof. Output component assembly 14 may include any suitable output component forms, such as, for example, audio speakers, headphones, audio line-outs, visual displays, antennas, infrared ports, rumblers, vibrators, or combinations thereof. It should be noted that one or more input component assemblies 12 and one or more output component assemblies 14 may sometimes be referred to collectively herein as an input/output ("I/O") interface. It should also be noted that an input component assembly 12 and an output component assembly 14 may sometimes be a single I/O component, such as a touch screen that may receive input information through a user's touch of a display screen and that may also provide visual information to a user via that same display screen.

Ejectable component assembly 16 may include any suitable assembly operative to insert and eject a removable module 30 from device 10. Removable module 30 may include, for example, any suitable type of integrated circuit card ("ICC"), chip card, memory card, flash memory card, microprocessor card, smart card, such as a subscriber identity module ("SIM") card (e.g., a mini-SIM card or a micro-SIM card), or combinations thereof. In some embodiments, removable module 30 may contain electronic circuitry from which electronic device 10 may read data and/or to which device 10 may write data.

Ejectable component assembly 16 can include a module tray 20 that may be insertable into (e.g., in the direction of arrow I) and ejectable from (e.g., in the direction of arrow O) housing 18 through housing opening 19. It is to be noted that although opening 19 is shown in FIG. 1 to be provided through a wall that may be defining a width of housing 18, opening 19 for ejectable component assembly 16 may be provided through any wall portion of housing 18. For example, in some embodiments, opening 19 for ejectable component assembly 16 may be provided through a wall that may be defining a length of housing 18, which may be longer than the wall defining the width of housing 18 (e.g., the wall of housing 18 along which input component assembly 12 is provided as shown in FIG. 1).

In some embodiments, housing 18 may include an outer periphery member that can provide a variety of attributes to electronic device 10 including for example, structural, functional, cosmetic, or combinations thereof. The outer periphery member may for example form at least a portion of the right, left, top, and bottom sides of device 10. As such, the outer periphery member may surround components that are placed in device 10 back to front, front to back, or center to back and front (e.g., components inserted within the volume defined by the outer periphery member). The outer periphery member may be formed from one or more elements, which may be similar or different depending on the dimensions or shape of device 10, as well as functional or structural considerations (e.g., outer periphery member elements serving as an antenna for tuning electromagnetic waves). If several elements are combined to form the outer periphery members, the elements can be connected in any suitable manner to form a single unit having adequate structural, functional, or cosmetic properties. In some cases, the outer periphery member can be formed from several elements that may act as a single integral unit (e.g., a unitary part). For example, the elements can be combined together as a single component using an assembly process (e.g., molding, welding, or an adhesive).

In some embodiments, such an outer periphery member of device 10 can define a band that forms an enclosed volume having a front and back open area. The band may define a ring-like structure that wraps around some or all of the components of electronic device 10. Electronic device 10 can include a variety of components, such as housing elements, electronics, structural members, or combinations of these. In some cases, one or more structural members (e.g., a midplate) can be connected to the outer periphery member within the volume enclosed by the outer periphery member to receive and support components, or enhance the structural properties of the outer periphery member.

In some embodiments, electronic device 10 can include front and back cover assemblies operative to cap the volume defined by such an outer periphery member. The cover assemblies can be positioned relative to the open areas of the outer periphery member and can include any suitable feature, including for example housing portions, access points, electronics, structural members, aesthetic members, or combinations thereof. In some embodiments, the cover assemblies can include one or more features for securing or retaining electronic device components within the volume enclosed by the outer periphery member. The cover assemblies can include surfaces defining the front and back surfaces of device 10. Each cover assembly can include a single enclosure member or can include several components such as, for example, a glass plate, a display, an input interface, or combinations of these.

Such an outer periphery member and front and back cover assemblies can provide some or all of the exterior surfaces of device 10, and thus define the outer periphery form or look and feel of electronic device 10. In particular, the front cover can substantially form the front surface of device 10, the back cover can substantially form the back surface of device 10, and the outer periphery member can substantially form the top, bottom, left, and right surfaces of device 10. It is to be understood, however, that some or all of the cover assemblies can instead or in addition provide part of the top, bottom, left, or right surfaces of device 10, and that some or all of the outer periphery member can provide part of the front or back surfaces of device 10. Therefore, in some embodiments, opening 19 for ejectable component assembly 16 may be provided through any such outer periphery member or band or cover assembly of device 10.

Tray 20 of ejectable component assembly 16 may include a body portion 22 extending between a first tray end 21 and a second tray end 23. Tray 20 may include an outer surface 21x at first end 21 to provide a cosmetic surface for device 10 when tray 20 is inserted into device 10. In some embodiments, outer surface 21x of tray 20 may be fashioned to be aesthetically pleasing to a user of device 10, for example, by matching the color and/or material of surface 21x with that of the exterior surface of housing 18 about opening 19 (e.g., any such outer periphery member or band or cover assembly of device 10 through which opening 19 may be provided). First tray end 21, second tray end 23, and/or body portion 22 may define the periphery and/or walls of a module holder 24. Module holder 24 may be operative to receive and hold removable module 30 with respect to tray 20 (e.g., when module 30 is inserted into holder 24 in the direction of arrow H). More particularly, module holder 24 may be operative to receive and hold removable module 30 with respect to an opening 26 that may be provided through a portion of tray 20.

Figure 2:
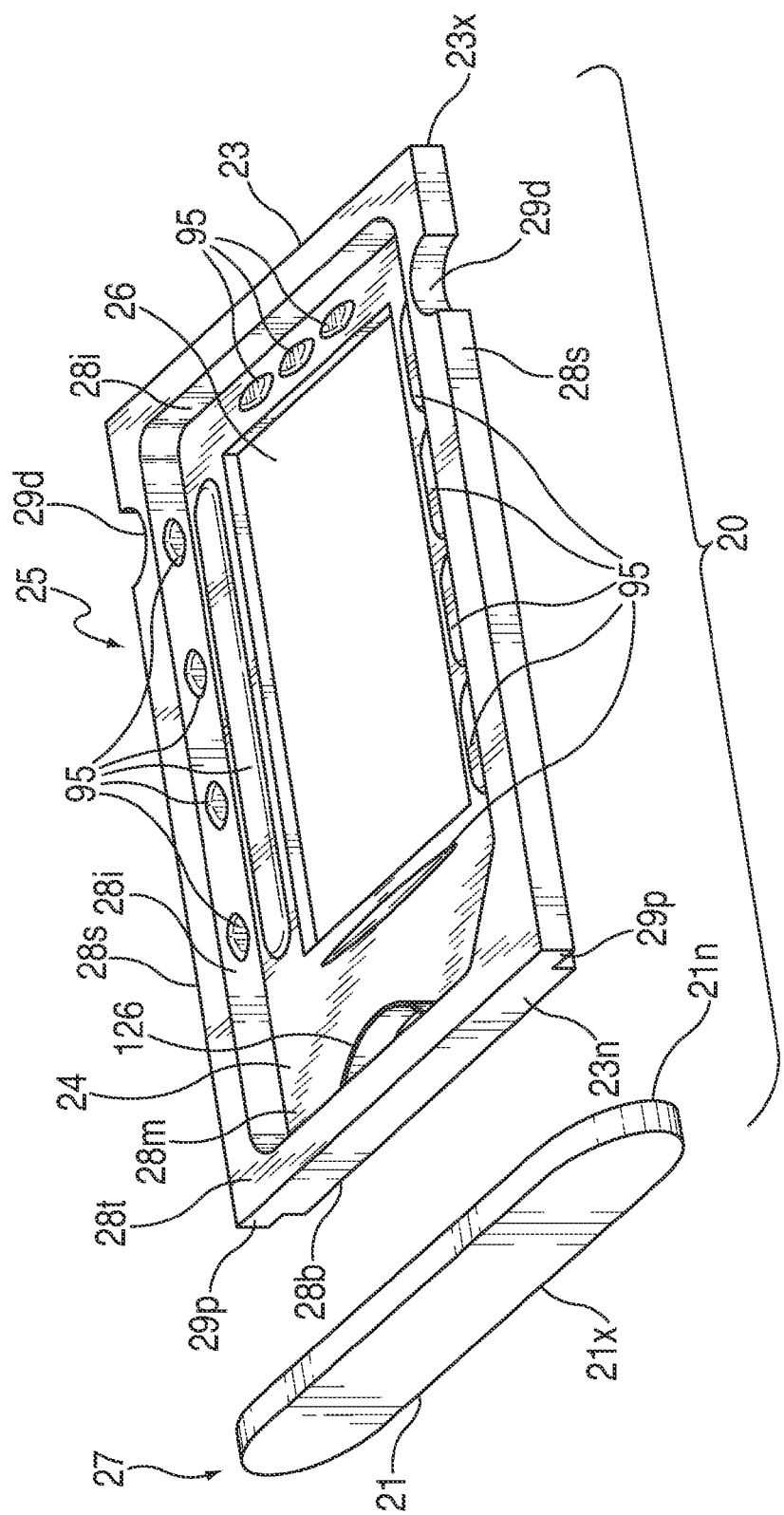
FIG. 2 is a perspective view of an illustrative tray of the ejectable component assembly of FIG. 1 in accordance with some embodiments of the invention.

Tray 20 may be formed as a single unitary component from any suitable material, such as plastic, glass, metal, ceramic materials, epoxies, composite materials, or the like. Moreover, tray 20 may be a single unitary component made by any suitable process, such as casting, molding, forming, forging, machining, extruding, and the like. Alternatively, tray 20 may be formed by joining at least two distinct tray portions. For example, as shown in FIG. 2, tray 20 may include a first tray component 25 and a second tray component 27. Second tray component 27 may be a cosmetic outer portion including outer surface 21x and an inner surface 21n. Second tray component 27 may be sized and shaped to fit within housing opening 19. First tray component 25 may be a module holding portion extending between an inner surface 23n and an outer surface 23x. Module holder 24 may be formed through a portion of top surface 28t of first tray component 25 to a middle surface 28m, and opening 26 may be formed through a portion of middle surface 28m to bottom surface 28b of first tray component 25. Holder 24 can be sized to substantially match that of a module (e.g., module 30 of FIG. 1), such that the module can be snap-fitted or otherwise releasably retained in holder 24, and such that a portion of the module may be exposed through opening 26. For example, opening 26 may allow electrical circuitry of electronic device 10 to access data from one or more electrical contacts of the module through opening 26 when tray 20 is partially or fully inserted into device 10.

One or more protrusions 29p may be formed along one or more portions of first tray component 25, such as along one or both of external side walls 28s. As described with respect to FIGS. 4-13, protrusions 29p may be of any suitable shape and size and may interact with correspondingly shaped elements of assembly 16 within device 10 in order to guide tray 20 into its appropriate position within device 10. As shown, the top of protrusions 29p may be in the same plane as top surface 28t of first tray component 25. In some embodiments, first tray component 25 may also include one or more detents 29d that may be placed on the top, bottom, or various sides of tray 20. For example, as shown in FIG. 2, each protrusion 29p may include at least one detent 29d formed into each side wall 28s of tray component 25 (e.g., adjacent end 23). As described with respect to FIGS. 4-13, detents 29d may interact with biased mechanisms of assembly 16 within device 10 in order to retain tray 20 in a functional position with device 10. The depth of each detent 29d may be selected based on any suitable criteria, including, for example, such that detent 29d may receive a portion of a spring mechanism for securing tray 20 in a functional position.

By creating tray 20 with at least two distinct tray components, each component may be made from different materials and by different processes than the other component, such that each component may be formed to have the most optimal properties for its specific functionalities. Second tray component 27 may be formed to be aesthetically pleasing to a user of device 10, for example, by matching the color and/or material of surface 21x with that of housing 18 about opening 19. Therefore, the materials, processes, and finishes used to form second tray component 27 may be chosen in accordance with those used to form the exterior surface of housing 18 about opening 19 (e.g., any such outer periphery member or band or cover assembly of device 10 through which opening 19 may be provided). While, on the other hand, the materials, processes, and finishes that may be used to form first tray component 25 may be chosen without respect to housing 18 and/or tray component 27, and tray component 25 may be formed such that the structure of module holder 24 and opening 26 are accurately dimensioned to receive a module.

Figure 6:
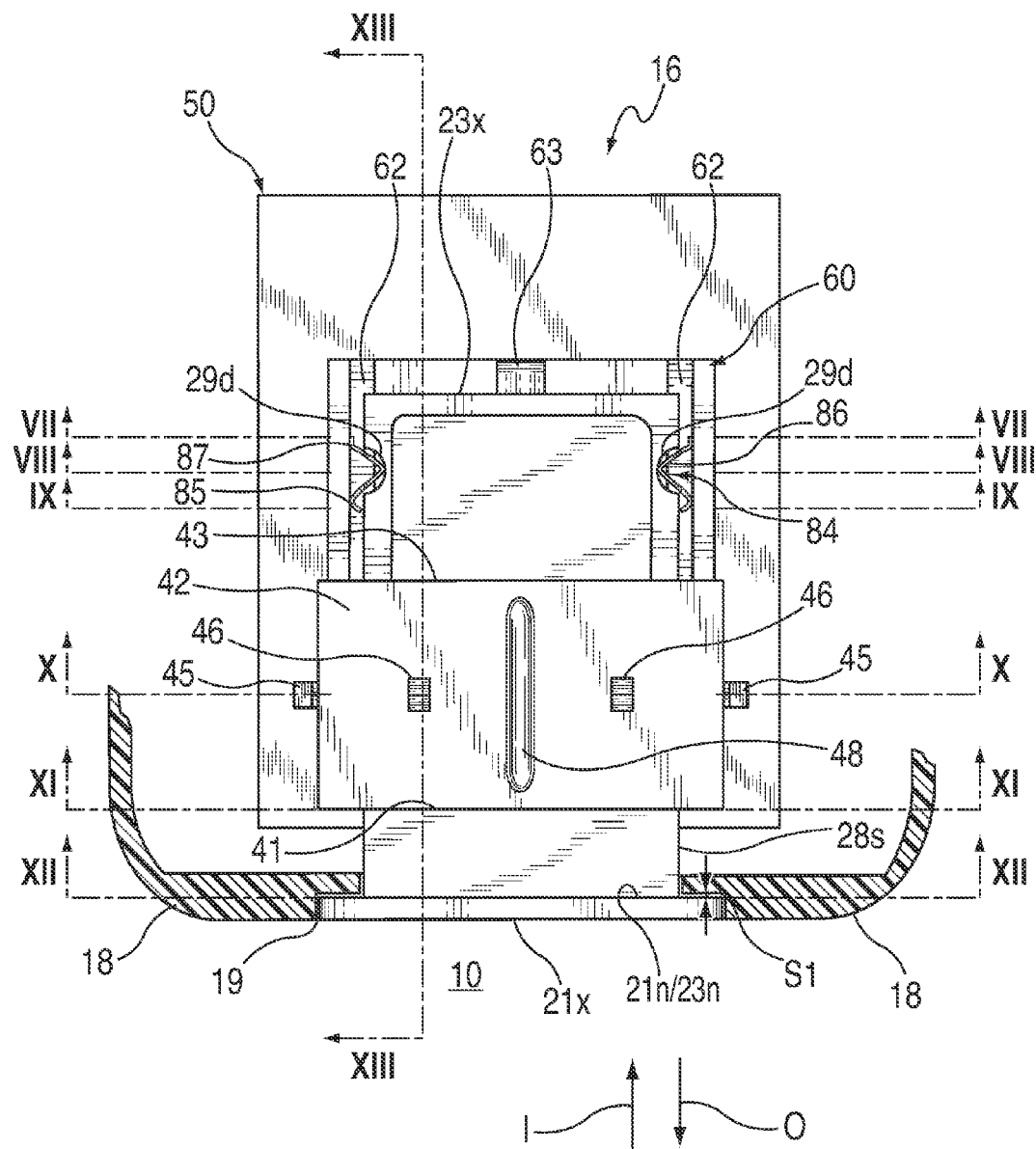
FIG. 6 is a top view of the ejectable component assembly and device of FIGS. 1, 4, and 5, taken from line VI-VI of FIG. 5, in accordance with some embodiments of the invention.
Figure 7:
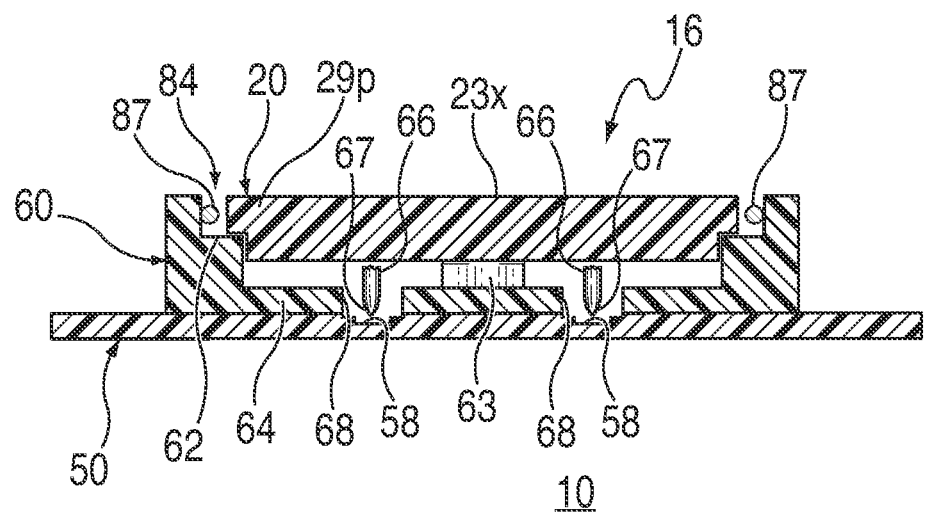
FIG. 7 is a cross-sectional view of the ejectable component assembly and device of FIGS. 1 and 4-6, taken from line VII-VII of FIG. 6, in accordance with some embodiments of the invention.
Figure 8:
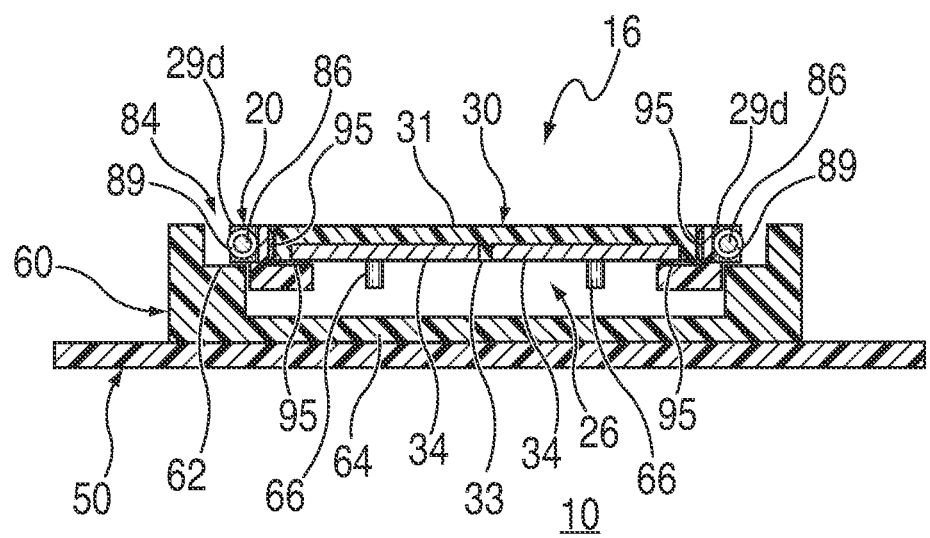
FIG. 8 is a cross-sectional view of the ejectable component assembly and device of FIGS. 1 and 4-7, taken from line VIII-VIII of FIG. 6, in accordance with some embodiments of the invention.
Figure 9:
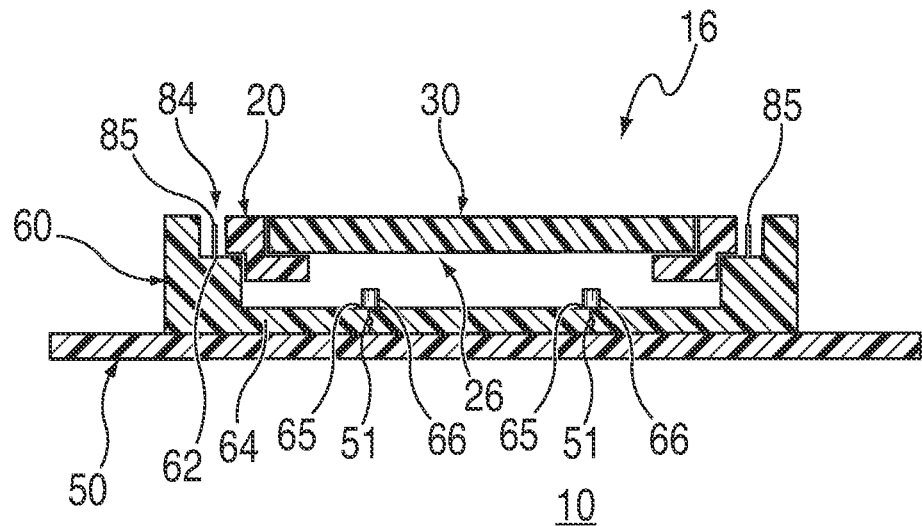
FIG. 9 is a cross-sectional view of the ejectable component assembly and device of FIGS. 1 and 4-8, taken from line IX-IX of FIG. 6, in accordance with some embodiments of the invention.
Figure 13:
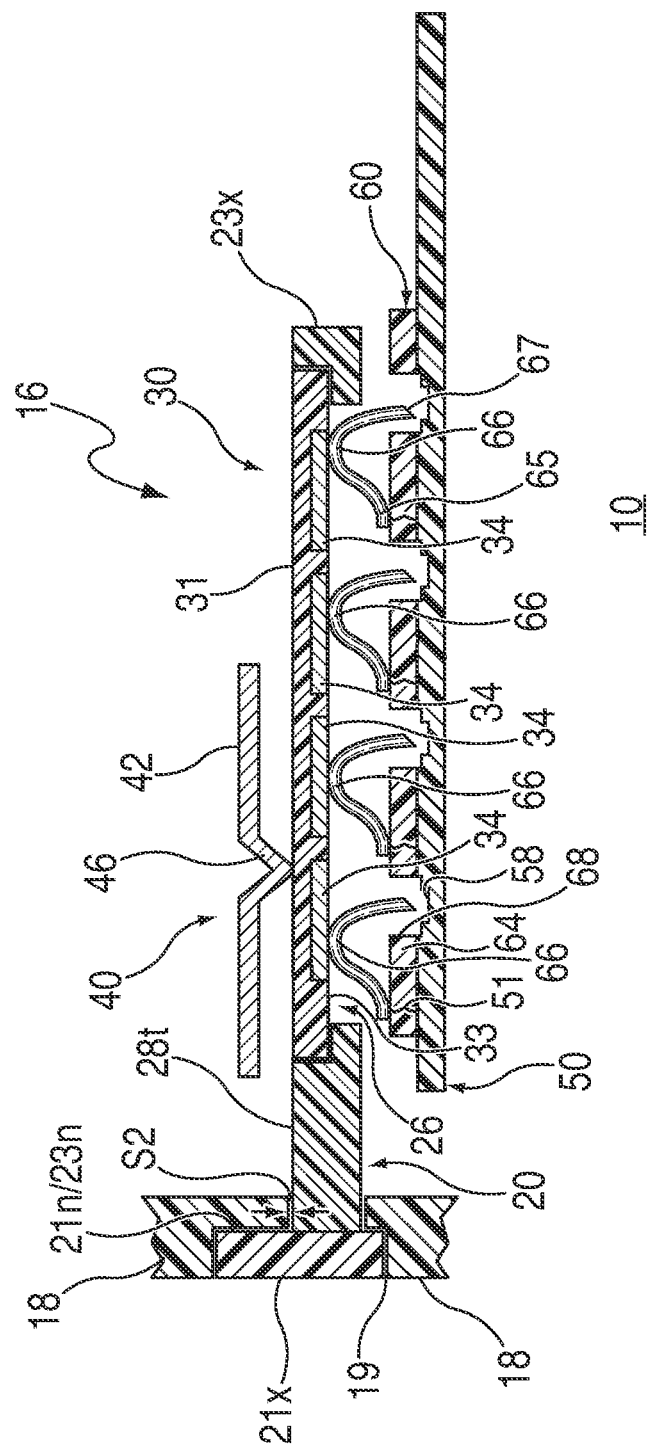
FIG. 13 is a cross-sectional view of the ejectable component assembly and device of FIGS. 1 and 4-12, taken from line XIII-XIII of FIG. 6, in accordance with some embodiments of the invention.

First tray component 25 and second tray component 27 may then be coupled to one another using any suitable process, such as brazing or welding. For example, inner surface 23n of first tray component 25 and inner surface 21n of second tray component 27 may be coupled to one another. By independently controlling the formation of tray components 25 and 27, as well as their connection to one another, the shapes created by the union of their various surfaces may be tightly controlled. For example, as shown in FIG. 6, a right angle may be formed at the union of side surface 28s of first component 25 and inner surface 21n of second component 27, and, as shown in FIG. 13, a right angle may be formed at the union of top surface 28t of first component 25 and inner surface 21n of second component 27. By matching the shape of such unions of surfaces of tray 20 with the shape of portions of housing 18 about opening 19, a tighter fit may be formed between tray 20 and housing 18 (e.g., smaller spacings S1 and/or S2 of FIGS. 6 and 13 may be achieved between housing 18 and tray 20). Such a tight clearance fit may produce a more aesthetically pleasing result and a more accurate system than may be possible if tray 20 were to be formed as a single unitary component and its surfaces' unions were to be merely machined, for example.

In some embodiments, the size of tray 20 may be of a small enough size where plastic or other similar materials may not provide the necessary rigidity, and metal or another conductive material may be used to form at least a portion of tray 20. In such embodiments, all of tray 20 or at least some of a conductive portion of tray 20 can be anodized, coated, and/or otherwise covered with a non-conductive material or element such that it may be insulated and rendered substantially not conductive. For example, if the removable module includes one or more electrical contacts that may touch tray 20 when the module is retained in module holder 24, at least that portion of tray 20 may be coated with a non-conductive material or otherwise covered with a non-conductive element so as not to short the electrical contacts of the module.

As described below with respect to FIGS. 4-13, a module may be positioned within holder 24 of tray 20 such that a surface of the module including one or more electrical contacts may be resting on middle surface 28m of tray 20. Therefore, in order to ensure that tray 20 does not short any electrical contacts of the module, a non-conductive element or coating may be applied to one or more portions of middle surface 28m and/or to one or more portions of internal surface 28i of tray 20 extending between surface 28m and top surface 28t (see, e.g., non-conductive portions 95 of FIGS. 2, 8, and 10). Such non-conductive portions 95 may be especially useful when a conductive tray 20 is used to hold a micro-SIM card or any other module that may include contacts that extend very close to if not all the way to one or more edges of the card (see, e.g., contacts 34 of FIG. 10, which may not only contact a non-conductive portion 95 applied to middle surface 28m of tray 20, but which may also extend to an edge of module 30 and contact a non-conductive portion 95 applied to an internal surface 28i of tray 20).

One or more non-conductive portions 95 may be applied to conductive tray 20 using any suitable approach, such as by physical vapor deposition ("PVD") using Parylene or any other suitable material, by spraying a non-conductive paint, by dip coating, by pad printing, by applying non-conductive labels, by adhering non-conductive elements, and the like. In some embodiments, one or more non-conductive portions 95 may be applied to tray 20 after tray components 25 and 27 have been coupled together, such that any fixtures used to join the tray components may not be able to rub off or otherwise degrade the non-conductive elements or coatings.

As mentioned, tray 20 may be configured to receive and retain any suitable module for insertion into device 10, such as an integrated circuit card, chip card, memory card, flash memory card, microprocessor card, smart card, such as a SIM card, and the like. As shown in FIGS. 1, 3A, and 3B, for example, module 30 may include a top surface 31 and a bottom surface 33. One or more electrical contacts 34 may be exposed along bottom surface 33. Therefore, when bottom surface 33 of module 30 is placed against middle surface 28*m* of holder 24 of tray 20, at least a portion of some or all of contacts 34 may be exposed through opening 26 of tray 20 (see, e.g., FIGS. 8, 10, and 13). In some embodiments, one or more module retainers or module retaining elements 126 may be coupled to one or more portions of holder 24 for retaining module 30 therein For example, retaining element 126 may be a spring flexure coupled to tray 20 such that the spring flexure may be compressed by removable module 30 upon its insertion into holder 24 for tightly retaining module 30 therein. Alternatively or additionally, module retaining element 126 may be any other suitable mechanism, including, but not limited to, a supporting rib of a compliant material, a flange, or the like. In other embodiments, module 30 may snap-fit into holder 24.

As mentioned, in some embodiments, tray 20 may be configured to hold a module 30 that is a micro-SIM card, whose dimensions and/or contact configurations may be determined by a particular specification (e.g., the ISO 7816 specification) . For example, module 30 as a micro-SIM card may have a particular length L, width W, and thickness T, such as about 15 millimeters, by 12 millimeters, by 0.76 millimeters, and the dimensions of holder 24 of tray 20 may be dimensioned similarly. However, in alternative embodiments, tray 20 may be configured to hold a module that is a mini-SIM card, whose dimensions and/or contact configurations may be determined by a different specification than the micro-SIM specification. For example, a mini-SIM specification may require a module to have the same contact configurations as a micro-SIM, but different dimensions than a micro-SIM, such as a length of 25 millimeters, a width of 15 millimeters, and a thickness of 0.76 millimeters. Therefore, while the electrical contacts of the two modules may be interchangeable, their different dimensions may prevent the two modules from being handled by the same tray 20.

Figure 3C:
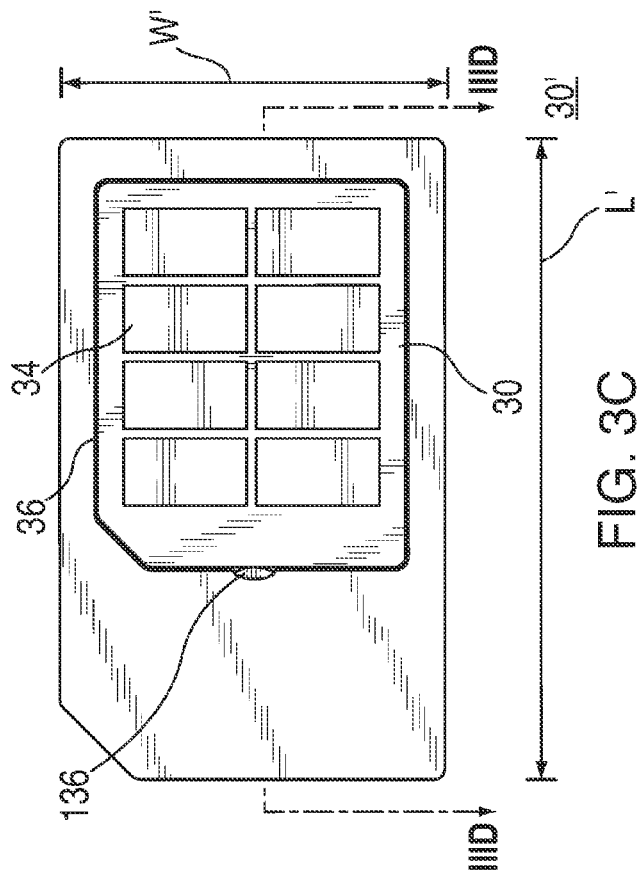
FIG. 3C is a bottom view of an adapter including the removable module of FIGS. 1, 3A, and 3B, in accordance with some embodiments of the invention.
Figure 3D:
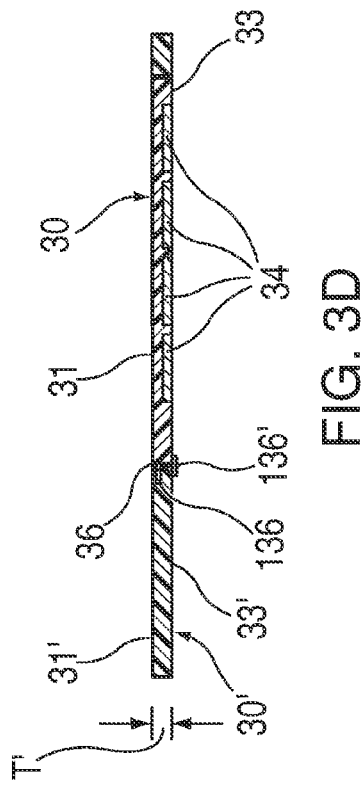
FIG. 3D is a side view of the adapter of FIG. 3C, taken from line IIID-IIID of FIG. 3C, in accordance with some embodiments of the invention.
Figure 3A:
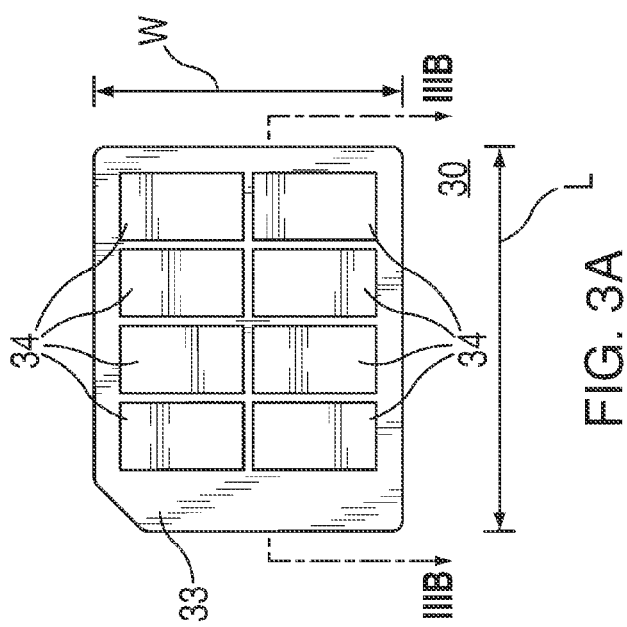
FIG. 3A is a bottom view of a removable module of the ejectable component assembly of FIG. 1, taken from line IIIA-IIIA of FIG. 1, in accordance with some embodiments of the invention.
Figure 3B:
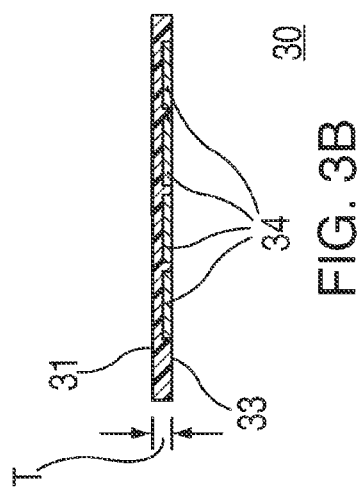
FIG. 3B is a side view of the removable module of FIGS. 1 and 3A, taken from line IIIB-IIIB of FIG. 3A, in accordance with some embodiments of the invention.

However, in some embodiments, as shown in FIGS. 3C and 3D, a module adapter 30' may be provided that can allow for a module of a first type to be handled by a tray configured to hold a module of a second type. For example, continuing with the example of module 30 being a micro-SIM card and tray 20 being configured to hold a mini-SIM card, adapter 30' may be configured to have the same dimensions as a mini-SIM card, but with an opening configured to hold a micro-SIM card. As shown in FIGS. 3C and 3D, adapter 30' may have a length L', a width W', and a thickness T', which may be configured to correspond to the length of 25 millimeters, the width of 15 millimeters, and the thickness of 0.76 millimeters required by a mini-SIM. However, adapter 30' may also include an opening 36 between its top surface 31' and its bottom surface 33' that may be configured to retain therein module 30 of FIGS. 3A and 3B. Opening 36 may be positioned in adapter 30' such that contacts 34 of module 30 may be positioned with respect to adapter 30' as would contacts of a module having the dimensions of adapter 30' (e.g., a mini-SIM card). Therefore, module 30 may be retained by adapter 30', and adapter 30' may be retained by tray 20 if tray 20 is configured to retain a mini-SIM card.

In some embodiments, one or more module retainers or module retaining elements 136 may be coupled to one or more portions of adapter 30' for retaining module 30 therein. For example, retaining element 136 may be a spring flexure coupled to adapter 30' such that the spring flexure may be compressed by removable module 30 upon its insertion into opening 36 for tightly retaining module 30 therein. Alternatively or additionally, module retaining element 136 may be any other suitable mechanism, including, but not limited to, a supporting rib of a compliant material, a flange, or the like. In other embodiments, a module retaining element 136' may be provided as a flange extending under opening 36 for supporting module 30. In yet other embodiments, module 30 may snap-fit into opening 36 of adapter 30'.

Adapter 30' may be formed of any suitable material, such as plastic, glass, metal, ceramic materials, epoxies, composite materials, and the like. Like tray 20, adapter 30' may be at least partially formed from metal or another conductive material. In such embodiments, at least some of the conductive portion or all of adapter 30' can be anodized and/or coated with a non-conductive material such that it may be insulated and rendered substantially not conductive. For example, if the removable module includes one or more electrical contacts that may touch adapter 30' when the module is retained in adapter 30', at least that portion of adapter 30' may be covered with a non-conductive material so as not to short the electrical contacts of the module (see, e.g., non-conductive portions 95 of tray 20).

Figure 4:
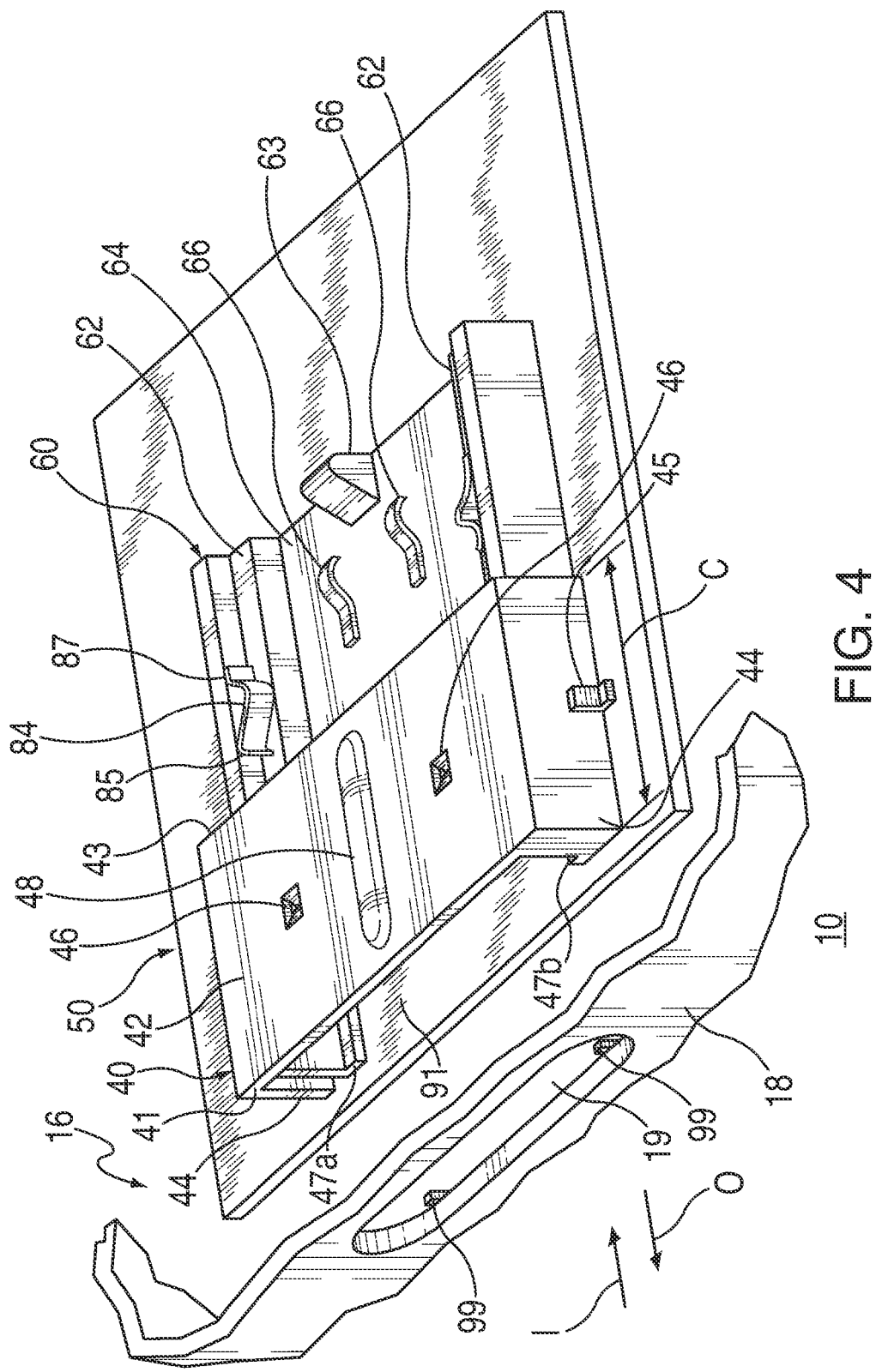
FIG. 4 is a perspective view of the ejectable component assembly and a portion of the device of FIG. 1, without a tray inserted therein, in accordance with some embodiments of the invention.
Figure 5:
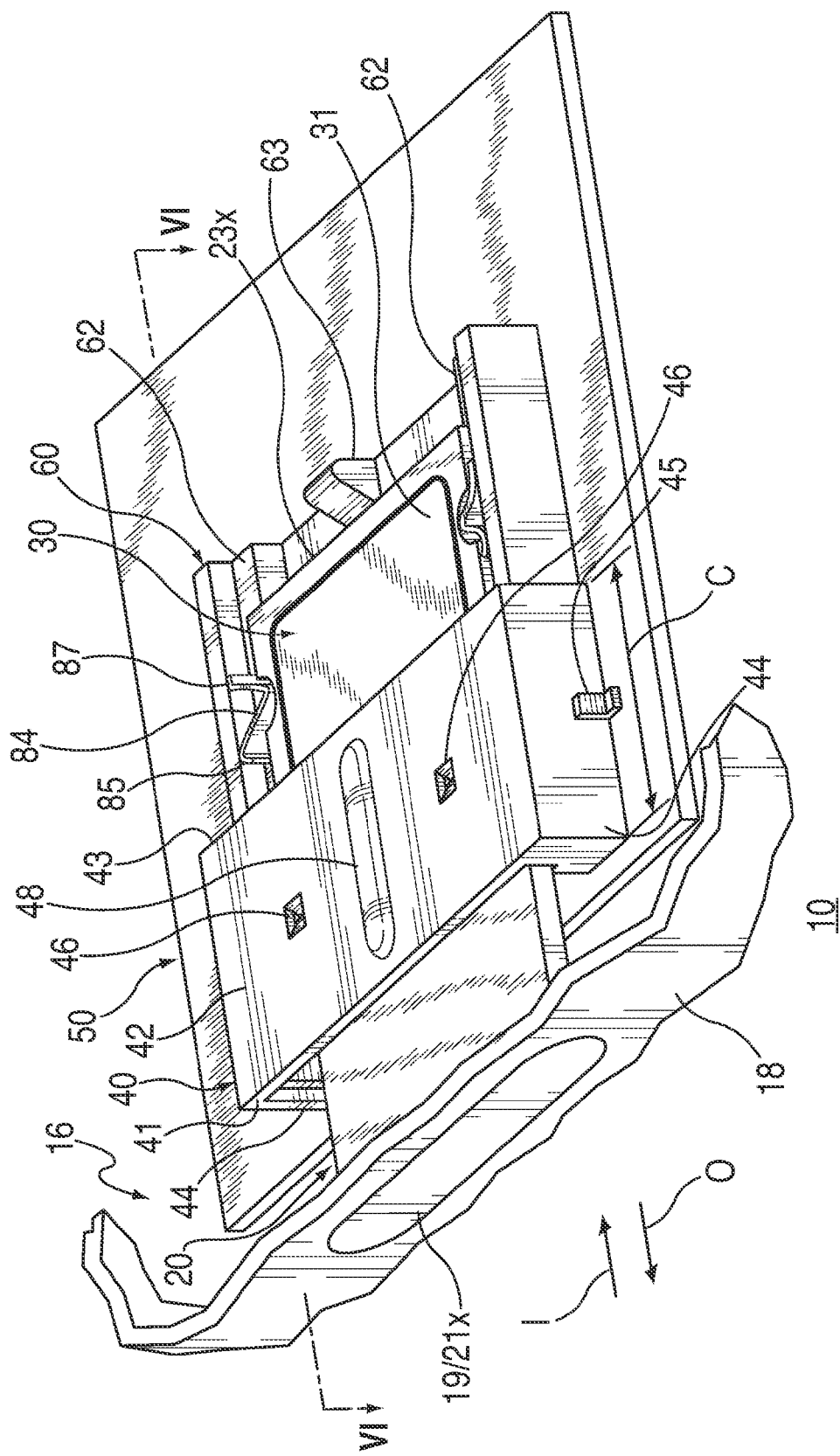
FIG. 5 is a perspective view of the ejectable component assembly and device of FIGS. 1 and 4, similar to FIG. 4, but with a tray inserted therein, in accordance with some embodiments of the invention.

FIGS. 4 and 5 are perspective views of a portion of device 10 including ejectable component assembly 16 before and after tray 20 is inserted in electronic device 10, respectively, in accordance with some embodiments of the invention. FIG. 6 is a top view of assembly 16 of FIG. 5, while FIGS. 7-13 are various cross-sectional views of assembly 16 of FIGS. 5 and 6. As shown, ejectable component assembly 16 may include a cage 40 positioned on top of a circuit board 50 and operative to receive and/or restrain tray 20 at least partially within the space defined between cage 40 and board 50. For example, as shown in FIGS. 4 and 5, cage 40 can include a top portion 42 that may be positioned above and that may be substantially parallel to circuit board 50. In some embodiments, cage 40 may include one or more sidewalls 44 extending from top portion 42 that may hold top portion 42 above circuit board 50 (e.g., cage 40 may resemble an upside-down U-shape coupled to circuit board 50). Module 30 may be placed in tray 20 and tray 20 may be slid through housing opening 19 in the direction of arrow I into the space defined by top cage portion 42, sidewall cage portions 44, and circuit board 50.

Cage 40 may have any suitable length C extending between a front cage end 41 and a back cage end 43, which may or may not extend over the entirety of tray 20 when tray 20 is fully inserted into device 10. Cage 40 may be formed of any suitable material, such as plastic, glass, metal, ceramic materials, epoxies, composite materials, and the like. Cage 40 may be coupled to any suitable component of assembly 16 and/or device 10, such as circuit board 50, using any suitable approach, including, for example, soldering, surface mount technology, welding, adhesives, and the like. For example, as shown in FIGS. 4-6 and 10, cage 40 may be coupled to circuit board 50 or any other suitable component of device 10 by one or more side cage coupling elements 45 (e.g., solder, adhesives, mechanical tabs, etc.), which may extend from one or more sidewalls 44 of cage 40.

Figure 11:
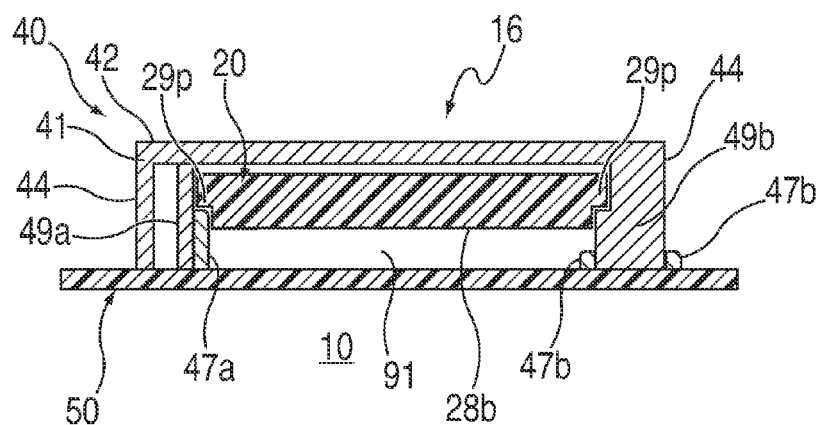
FIG. 11 is a cross-sectional view of the ejectable component assembly and device of FIGS. 1 and 4-10, taken from line XI-XI of FIG. 6, in accordance with some embodiments of the invention.
Figure 12:
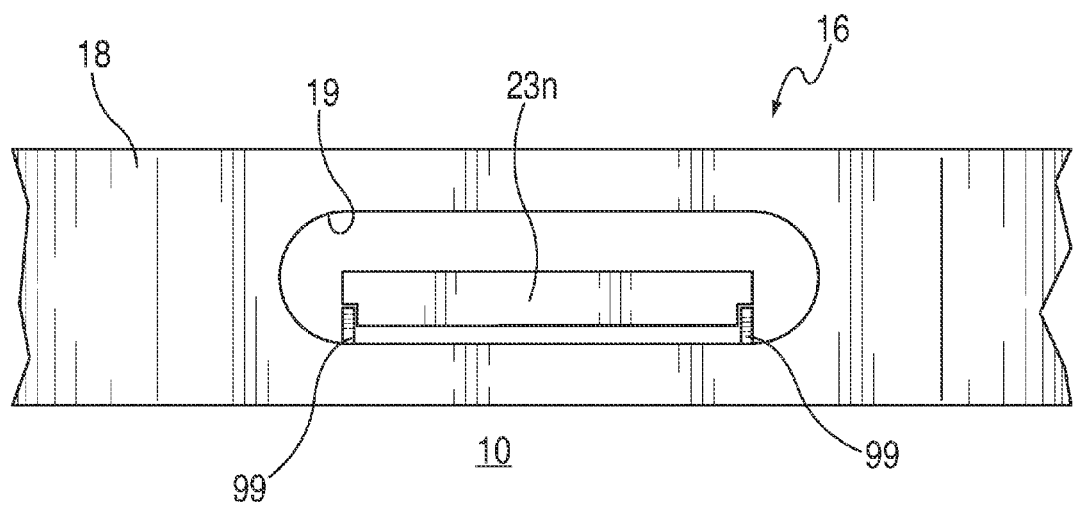
FIG. 12 is a cross-sectional view of the ejectable component assembly and device of FIGS. 1 and 4-11, taken from line XII-XII of FIG. 6, in accordance with some embodiments of the invention.

Additionally or alternatively, cage 40 may be coupled or mounted to circuit board 50 or any other suitable component of device 10 by one or more front cage fixing or coupling coupling elements 47 (e.g., solder, adhesives, mechanical tabs, etc.). For example, as shown in FIGS. 4, 5, and 11, cage 40 may include one or more front cage coupling elements 47 that may extend from top wall 42 and/or one or more sidewalls 44 at or near front cage end 41. Each front cage coupling element 47 may span at least a portion of front opening 91 defined by board 50, top wall 42, and sidewalls 44 at or near front cage end 41 through which tray 20 passes. In some embodiments, cage 40 may include one or more middle walls 49a, which may be positioned between side walls 44 at front end 41 of cage 40, and which may extend from top wall 42 at least partially to circuit board 50 or any other suitable portion of device 10. Middle wall 49a may span across at least a portion of front opening 91. Cage 40 may be coupled to circuit board 50 or any other suitable portion of device 10 by one or more front cage coupling elements 47a (e.g., solder, adhesives, mechanical tabs, etc.), which may extend from middle wall 49a and/or directly from top wall 42 to circuit board 50 or any other suitable portion of device 10. Additionally or alternatively, cage 40 may include a corner wall 49b, which may be positioned to extend from one of side walls 44 at or near front end 41 of cage 40, and which may extend from top wall 42 at least partially to circuit board 50 or any other suitable portion of device 10. Corner wall 49b may span across at least a portion of front opening 91. Cage 40 may be coupled to circuit board 50 or any other suitable portion of device 10 by one or more front cage coupling elements 47b (e.g., solder, adhesives, mechanical tabs, etc.), which may extend from corner wall 49b to circuit board 50 or any other suitable portion of device 10. By coupling cage 40 to circuit board 50 or any other suitable portion of device 10 at or near front end 41 of cage 40, the potential for cage 40 to move in the direction of arrow I and/or 0 may be reduced.

As shown in FIG. 11, for example, each one of front cage coupling element 47a, front cage coupling element 47b, middle wall 49a, and corner wall 49b may be positioned within front opening 91. In some embodiments, one or more of front cage coupling element 47a, front cage coupling element 47b, middle wall 49a, and corner wall 49b may be positioned within opening 91 so as to be a keying element for guiding tray 20 through opening 91 only if tray 20 is in a proper orientation with respect to device 10. For example, tray 20 may only pass through opening 91 if protrusion 29p is properly positioned or oriented with respect to the keying element. This may ensure that tray 20 is properly being inserted with bottom surface 28b facing downwardly towards circuit board 50. In other embodiments, as shown at least in FIGS. 4 and 12, a keying element may alternatively or additionally be provided by a keying plate 99, which may be coupled to an interior surface of housing 18 about opening 19. Keying plate 99 may be coupled to housing 18 in any suitable manner, such as by welding or otherwise adhering plate 99 to housing 18 or by machining plate 99 from housing 18. Keying plate 99 may be colored or otherwise treated to match housing 18 or to be discrete such that it is not visible through opening 19 by a user of device 10.

Circuit board 50 may be any type of circuit board, such as a printed circuit board ("PCB"), logic board, printed wiring board, etched wiring board, or any other suitable board that may be used to mechanically support and electronically connect various electrical components (e.g., component assemblies 12, 14, and 16). Circuit board 50 can be constructed using one or more layers of a non-conductive substrate and signal conducting pathways. The signal conducting pathways may exist in one or more layers or in each layer of the non-conductive substrate. The signal conducting layers, sometimes referred to as traces, members, or leads, may be a metal conductive material (e.g., copper or gold) or an optical conductive material (e.g., fiber optics). When one or more portions of component assemblies 12, 14, and 16 are electrically coupled to board 50 via coupling circuitries, board 50 may communicate with the one or more component assemblies of device 10 using the signal conducting layers.

To further guide and retain tray 20 within device 10, assembly 16 may include a guide component 60. Guide 60 may be coupled to any suitable element within assembly 16 and/or device 10, such as circuit board 50. Guide 60 may be of any suitable shape and may be placed in any suitable location within device 10 to guide and/or retain at least a portion of tray 20 and/or module 30. In some embodiments, guide 60 may extend along circuit board 50 at least partially within cage 40. Guide 60 may be formed of any suitable material, such as plastic, glass, metal, ceramics, epoxies, composite materials, or the like.

In order to guide tray 20 within device 10, guide 60 may include rail portions 62 that can have a shape that substantially complements portions of tray 20 (e.g., protrusions 29p). For example, when tray 20 is inserted into device 10 in the direction of arrow I, protrusions 29p may mate with and slide along rail portions 62 of guide 60. Protrusions 29p and guide rails 62 may be any suitable complementary shapes that may promote the sliding of tray 20 along rails 62. Guide 60 may also include a wedge ramp 63 operative to assist in retaining module 30 in tray 20. Ramp 63 may be of any suitable shape and may be placed in any suitable position within guide 60. In some embodiments, ramp 63 may be positioned such that the tip of tray 20 (e.g., tray end 23) is maintained away from circuit board 50. This may allow ramp 63 to bias tray 20 up to secure module 30 between module holder 24 and the bottom of cage 40, and to prevent tray 20 from slipping underneath module 30 during removal (e.g., when the walls 28i of module holder 24 are less than the thickness T of module 30).

Assembly 16 may also include a base module 64, which may be mechanically supported and electronically coupled to various other components in device 10, such as circuit board 50. Base module 64 can be, for example, any integrated circuit ("IC"), such as a microchip, silicon chip, or computer chip. In some embodiments, base 64 may provide an interface for module 30 to electrically communicate with other components in device 10 (e.g., board 50). In some embodiments, base 64 and guide 60 may be integrated into a single unitary component (e.g., a single plastic block). In some embodiments, cage 40 may be at least partially coupled to guide 60 and/or base 64 as opposed to or in addition to circuit board 50.

Cage 40, guide 60, and base 64 may collectively define a shelf or receiving assembly for receiving, guiding, and holding tray 20 and/or module 30 within device 10. In some embodiments, cage 40, guide 60, and base 64 may be integrated into a single unitary component (e.g., a single block of plastic or any other suitable material or combination of materials). While cage 40 of the receiving assembly may help to limit the movement of tray 20 in the "Z" direction above board 50 and/or base 64, and while base 64 of the receiving assembly may help to limit the movement of tray 20 in the "Z" direction below cage 40, guide 60 of the receiving assembly may help to limit the movement of tray 20 in the "X" and/or "Y" directions between cage 40 and board 50 and/or base 64.

Base 64 may include one or more electrical pins 66 that may electrically couple with one or more conductive portions of module 30 (e.g., module contacts 34). For example, as shown in at least FIGS. 4, 8-10, and 13, one or more electrical pins 66 may each be coupled at one end to base 64 and may be configured to extend up away from the periphery of base 64 and into tray opening 26 for electrically coupling with a respective contact 34 of module 30. Module contacts 34 can include any suitable integrated circuit ("IC"), such as a microchip, silicon chip, or computer chip that may include semiconductor and/or passive components in the surface of a thin substrate of semiconductor material (e.g., on bottom surface 33 of module 30). The electrical contact between module contacts 34 and electrical pins 66 may allow device 10 to read data from and/or write data into module 30. The data read from and/or written into module 30 may take any electrical form, and the communication between module 30 and device 10 may be synchronous or asynchronous.

Electrical pins 66 may have any suitable shape. For example, each electrical pin 66 may be biased to deflect upward away from base 64 and through opening 26 in tray 20. Electrical pins 66 may include springs or wedges operative to contact module 30. For example, electrical pins 66 may be coupled to any suitable location or portion of base 64 to form a cantilever spring. Each electrical pin 66 may be formed from any suitable conductive material (e.g., a metallic conductor, semiconductor, or superconductor) to communicate with electrical contacts 34 of module 30. In some embodiments, as shown in at least FIGS. 9 and 13, a first end 65 of each electrical pin 66 may be coupled to base 64. Furthermore, in some embodiments, first pin end 65 and base 64 may be electrically coupled to circuit board 50 (e.g., via a wire 51), such that electrical data may be communicated between module 30 and board 50 through pin 64. Circuit board 50 may then communicate this data to various other components of device 10 (e.g., component assemblies 12 and/or 14).

Although each pin 66 may at least initially extend away from first end 65 and base 64 up towards tray 20, a second free end of each pin may eventually deflect downwards back towards base 64. For example, as shown in at least FIGS. 7 and 13, a second end 67 of each electrical pin 66 may be free and may be biased to deflect downwards towards base 64. In some embodiments, base 64 may include one or more gaps or at least recesses 68 for allowing second end 67 of each pin 66 to pass therethrough or at least deflect therein. Moreover, in some embodiments, circuit board 50 may also include one or more gaps or at least recesses 58 for allowing second end 67 of each pin 66 to deflect therein after having passed through a base gap 68. The additional deflection afforded to pins 66 by base gaps 68 and circuit board recesses 68 may prevent pins 66 from being permanently deformed as a result of a strong downward force exerted by tray 20 and/or module 30 on pins 66 toward board 50. When tray 20 is being removed from device 10, second pin ends 67 may deflect upwards away from board 50, but, due to the additional downward deflection afforded to pins 66 by base gaps 68 and circuit board recesses 58, pins 66 may be biased such that second pin ends 67 may not deflect upwards so much so that they can be snagged by tray 20 upon its removal.

Figure 10:
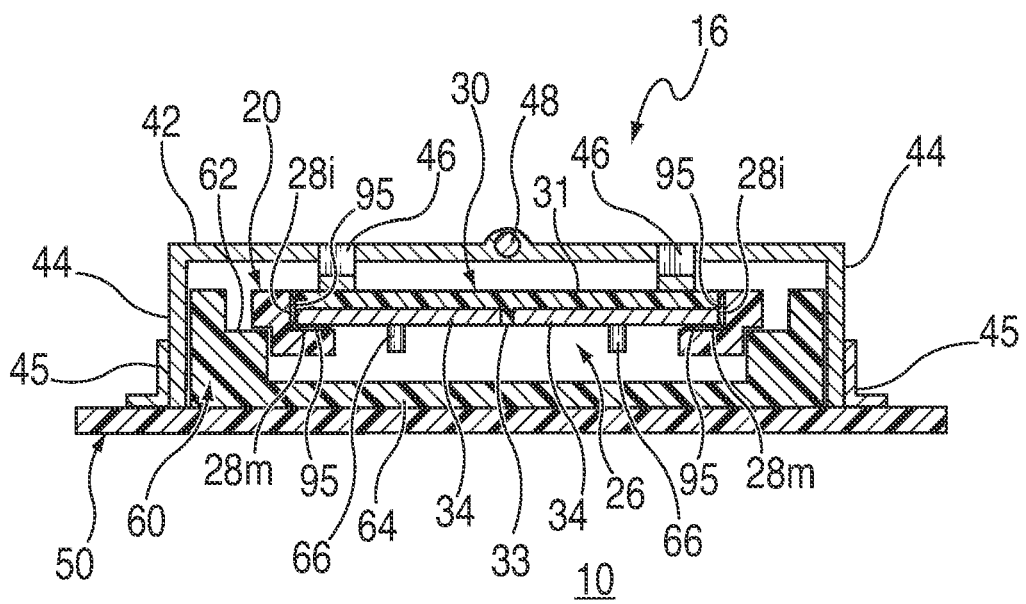
FIG. 10 is a cross-sectional view of the ejectable component assembly and device of FIGS. 1 and 4-9, taken from line X-X of FIG. 6, in accordance with some embodiments of the invention.

In some embodiments, as shown in at least FIGS. 10 and 13, cage 40 may include one or more biasing elements 46 extending downwardly from or through top wall portion 42 for contacting and forcing or biasing module 30 towards holder 24 of tray 20. The force applied by each biasing element 46 may also bias module 30 towards electrical pins 66 of base 64, thus enhancing their electrical contact. Each biasing element 46 may include any suitable type of spring, protrusion, wedge, or other suitable component to force or bias module 30 towards base 64. For example, biasing element 46 may include a tension spring, extension spring, compression spring, torsional spring, wire spring, coil spring, flat spring, cantilever spring, helical spring, hairspring, balance spring, leaf spring, or any combination thereof. Each biasing element 46 may be coupled to cage 40 using any suitable approach or may instead or in addition be constructed as part of cage 40 (e.g., as a protrusion or cutout). Moreover, cage 40 may include one or more stiffening ribs 48 that may extend along or through at least a portion of top wall 42 for providing additional rigidity to cage 40.

As described above, guide 60 may be operative to engage and retain tray 20. For example, guide 60 can include one or more rail features 62 that may be constructed to complement tray protrusions 29p of tray 20. Rails 62 and protrusions 29p may include complementing features to assist in guiding tray 20 into assembly 16 (e.g., towards its functional position with module 30 above pins 66 of base 64) and to retain the periphery of tray 20 (e.g., side walls 28s).

As also mentioned, tray 20 may include at least one detent 29d. Each detent 29d may be operative to receive a portion of a biasing mechanism for holding tray 20 within assembly 16 at its functional position. In some embodiments, as shown in at least FIGS. 4-9, a biasing mechanism 84 may be fixed at a first end 85 and may include a middle portion 86 biased towards tray 20. For example, each detent 29d may be operative to receive a middle portion 86 of a biasing mechanism 84, such that when tray 20 is fully inserted in device 10 at its functional position, middle portion 86 may engage at least one detent 29d. In some embodiments, first end 85 of a biasing mechanism 84 may be fixed to guide 60 (e.g., at a position on a rail 62) or another portion of device 10. A second end 87 of biasing mechanism 84 may abut or otherwise contact guide 60 or another portion of device 10, so as to apply pressure against second end 87 such that it may not be totally free to move in any direction Alternatively, a second end 87 of biasing mechanism 84 may be fixed to guide 60 or another portion of device 10, so as to apply pressure against second end 87 such that it may not be totally free to move in any direction. This may make biasing mechanism 84 more robust for biasing middle portion 86 against tray 20 and for further ensuring that tray 20 remains substantially immobile within device 10 at its functional position.

Each end of biasing mechanism 84 may be coupled to, fixed on, abut, or otherwise contact any other suitable component within device 10 besides guide 60 in other embodiments, such as cage 40, for example. Biasing mechanism 84 may be of any suitable spring type, such as a tension spring, extension spring, compression spring, torsional spring, wire spring, coil spring, flat spring, cantilever spring, helical spring, hairspring, balance spring, leaf spring, or any combination thereof, as to effectively assist in retaining tray 20. Biasing mechanism 84 may be formed of any suitable material, such as stainless steel and the like. If middle portion 86 of biasing mechanism 84 and at least detent 29d of tray 20 are both metal, for example, one or both of middle portion 86 and detent 29d may be provided with an over mold 89 (e.g., of plastic) or any other suitable coating or element in order to prevent galling.

It is to be understood that, although ejectable component assembly 16 has been described as including a tray 20 for loading a removable module 30 into device 10, tray 20 may be unnecessary and any removable module or module/adapter combination to be inserted into device 10 may be shaped with some or all of the features of tray 20. For example, a removable module can be provided that may be substantially the same as removable module 30, but that also can include a first end shaped similarly to end 21x of tray 20, a second end shaped similarly to end 23x of tray 20, and projections/detents shaped similarly to projections 29p/detents 29d of tray 20, such that the module may be inserted into and removed from device 10 in the same way that tray 20 may be inserted into and removed from device 10.

Figure 14:
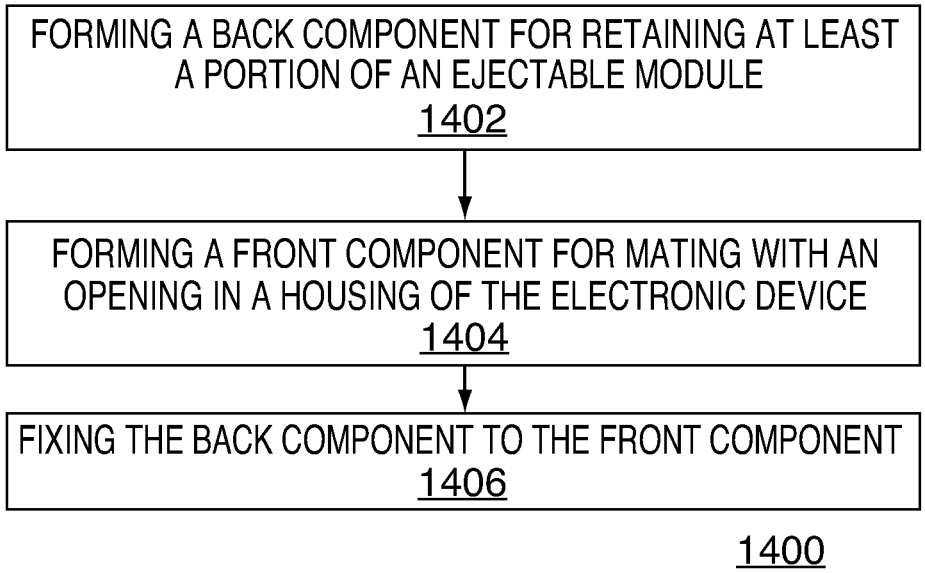
FIG. 14 is a flowchart of an illustrative process for manufacturing a tray of an ejectable component assembly in accordance with some embodiments of the invention.

FIG. 14 is a flowchart of an illustrative process 1400 for manufacturing a tray of an ejectable component assembly. At step 1402 of process 1400, a back component of a tray for retaining at least a portion of an ejectable module may be formed. At step 1404, a front component for mating with an opening in a housing of an electronic device may be formed. Then, at step 1406, the back component may be fixed to the front component. By creating a tray with at least two distinct tray components, each component may be made from different materials and by different processes than the other component, such that each component may be formed to have the most optimal properties for its specific functionalities. For example, the front component may be formed to be aesthetically pleasing to a user of the electronic device, for example, by matching the color and/or material of the component with that of the device housing. Therefore, the materials, processes, and finishes used to form the front component may be chosen in accordance with those used to form the device housing. On the other hand, the materials, processes, and finishes that may be used to form the back component may be chosen without respect to the device housing and/or the front component, and instead the back component may be formed such that the structure of the back component is strong enough and accurately dimensioned to receive the ejectable module. The back component and the front component may be fixed to one another using any suitable process, such as brazing or welding.

It is understood that the steps shown in process 1400 of FIG. 14 are merely illustrative and that existing steps may be modified or omitted, additional steps may be added, and the order of certain steps may be altered.

Figure 15:
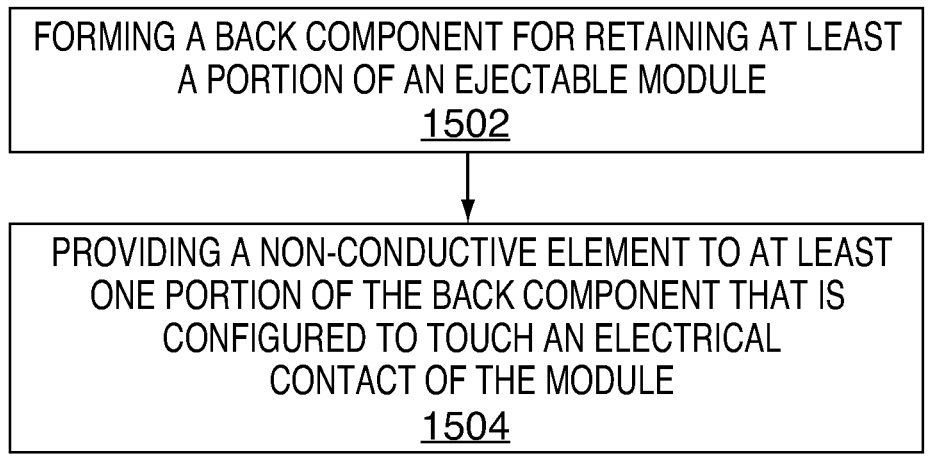
FIG. 15 is a flowchart of an illustrative process for manufacturing a tray of an ejectable component assembly in accordance with some other embodiments of the invention.

FIG. 15 is a flowchart of another illustrative process 1500 for manufacturing a tray of an ejectable component assembly. At step 1502 of process 1500, a back component of a tray for retaining at least a portion of an ejectable module may be formed. At step 1504, a non-conductive element may be provided to at least one portion of the back component that is configured to touch an electrical contact of the module. For example, one or more non-conductive portions may be applied to the back component using any suitable approach, such as by physical vapor deposition ("PVD") using Parylene or any other suitable material, by spraying a non-conductive paint, by dip coating, by pad printing, by applying non-conductive labels, by adhering other suitable non-conductive elements, and the like. In some embodiments, such non-conductive elements may be applied to the back component of the tray after the back component has been fixed to a front component. Such non-conductive portions may be especially useful when the back component is conductive and configured to retain a micro-SIM card or any other module that may include contacts that extend very close to if not all the way to one or more edges of the card.

It is understood that the steps shown in process 1500 of FIG. 15 are merely illustrative and that existing steps may be modified or omitted, additional steps may be added, and the order of certain steps may be altered.

While there have been described systems and methods for providing compact ejectable assemblies in electronic devices, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms such as "up" and "down," "front" and "back," "top" and "bottom" and "side," "length" and "width" and "thickness," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the invention may be of any suitable three-dimensional shape, including, but not limited to, a sphere, cone, octahedron, or combination thereof, rather than a hexahedron, as illustrated by FIGS. 1-15.

Therefore, those skilled in the art will appreciate that the invention can be practiced by other than the described embodiments, which are presented for purposes of illustration rather than of limitation.

The invention claimed is:

1. A tray for inserting a removable module into an electronic device comprising:
   a first tray component that retains at least a portion of a module when the module is placed in the first tray component, the first tray component formed of a conductive material and including a portion covered with a non-conductive element that is positioned proximate to an electrical contact of the module when the module is placed in the first tray component; and
   a second tray component coupled to the first tray component that mates with an opening in a housing of an electronic device when the tray is inserted into the electronic device.

2. The tray of claim 1, wherein the first tray component is configured to retain at least one of an integrated circuit card, a chip card, a memory card, a flash memory card, a microprocessor card, a smart card, a subscriber identity module card, a mini-subscriber identity module card, or a micro-subscriber identity module card.

3. The tray of claim 1, wherein the first tray component and the second tray component are formed from different materials.

4. The tray of claim 1, wherein the second tray component is formed from a same material as a surface of the housing of the electronic device.

5. The tray of claim 1, wherein the first tray component includes at least one detent that interacts with at least one biasing mechanism of the electronic device to retain the tray when the tray is inserted into the electronic device.

6. The tray of claim 1, wherein the first tray component includes at least one retaining element for retaining the portion of the module when the module is placed in the first tray component.

7. The tray of claim 6, wherein the at least one retaining element comprises at least one spring flexure that is compressed by the module when the module is placed in the first tray component.

8. The tray of claim 1, wherein the first tray component includes at least one opening.

9. The tray of claim 8, wherein at least one electrical contact of the module is exposed through the opening of the first tray component when the module is placed in the first tray component.

10. The tray of claim 1, wherein the first tray component includes at least one protrusion that guides the into the electronic device when the tray is inserted into the electronic device.

11. A method for forming a tray for an ejectable module assembly of an electronic device comprising:
   forming a first tray component that retains at least a portion of an ejectable module when the ejectable module is placed in the first tray component of a conductive material;
   applying a non-conductive element to at least one portion of the first tray component that is positioned proximate to an electrical contact of the ejectable module when the ejectable module is placed in the first tray component;
   forming a second tray component that is operable to mate with an opening in a housing of an electronic device; and
   coupling the first tray component to the second tray component.

12. The method of claim 11, wherein:
   said operation of forming the first tray component comprises using a first process and a first material;
   said operation of forming the second tray component comprises using a second process and a second material; and
   at least one of the first process is different than the second process and the first material is different than the second material.

13. The method of claim 11, wherein the coupling comprises at least one of brazing or welding.

14. The method of claim 11, wherein said operation of forming the first tray component comprises forming the first tray component to retain at least one of an integrated circuit card, a chip card, a memory card, a flash memory card, a microprocessor card, a smart card, a subscriber identity module card, a mini-subscriber identity module card, or a micro-subscriber identity module card.

15. An electronic device comprising:
   a housing having an opening;
   a tray that is insertable through the opening, the tray comprising:
      a first tray component that retains at least a portion of a module when the module is placed in the first tray component; and
      a second tray component coupled to the first tray component that mates with the opening when the tray is inserted into the electronic device;
   a biasing mechanism that biases the module onto the first tray component when the tray is at least partially inserted into the electronic device;
   a cage having a top wall portion wherein the biasing mechanism is coupled to the top wall portion; and
   a wedge that forces the first tray component towards the top wall portion when the tray is at least partially inserted into the electronic device.

16. The electronic device of claim 15, wherein the first tray component is configured to retain an additional module when the additional module is placed in the first tray component, the additional module having different dimensions than the module.

17. The electronic device of claim 15, further comprising a guide into which the first tray component is inserted when the tray is at least partially inserted into the electronic device.

18. The electronic device of claim 17, wherein the wedge is coupled to the guide.

19. The electronic device of claim 17, wherein the guide includes a rail having a shape complementary to the first tray component.

20. The electronic device of claim 15, wherein the biasing mechanism comprises at least one of a spring, protrusion, or wedge.

* * * * *